US010833286B2

(12) United States Patent
Jia

(10) Patent No.: US 10,833,286 B2
(45) Date of Patent: Nov. 10, 2020

(54) ENCAPSULATING METHOD FOR OLED CAPSULE STRUCTURE, FORMING METHOD FOR OLED LIGHT-EMITTING LAYER, AND OLED CAPSULE STRUCTURE

(71) Applicant: Guangdong OPPO Mobile Telecommunications Corp., Ltd., Guangdong (CN)

(72) Inventor: Yuhu Jia, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/420,928

(22) Filed: May 23, 2019

(65) Prior Publication Data
US 2019/0363283 A1 Nov. 28, 2019

(30) Foreign Application Priority Data

May 25, 2018 (CN) .......................... 2018 1 0522258
May 25, 2018 (CN) ..................... 2018 2 0801433 U

(51) Int. Cl.
H01L 51/52 (2006.01)
H01L 51/50 (2006.01)
(Continued)

(52) U.S. Cl.
CPC .... *H01L 51/5012* (2013.01); *H01L 21/02271* (2013.01); *H01L 51/0006* (2013.01); *H01L 51/529* (2013.01); *H01L 51/5237* (2013.01)

(58) Field of Classification Search
CPC ........... H01L 51/5012; H01L 21/02271; H01L 51/0006; H01L 51/5237; H01L 51/529
See application file for complete search history.

(56) References Cited

U.S. PATENT DOCUMENTS

| 2004/0097005 | A1 | 5/2004 | Daniels |
| 2010/0171133 | A1 | 7/2010 | Yanashima et al. |
| 2015/0072092 | A1* | 3/2015 | Seo ........................ C09K 11/02 |
| | | | 428/36.91 |

FOREIGN PATENT DOCUMENTS

| CN | 106887531 A | 6/2017 |
| CN | 104267523 B | 9/2017 |
(Continued)

OTHER PUBLICATIONS

International search report issued in corresponding international application No. PCT/CN2019/088173, dated Aug. 30, 2019 (4 pages).
(Continued)

*Primary Examiner* — Matthew L Reames

(57) ABSTRACT

The present disclosure provides a method for encapsulating an organic light-emitting diode (OLED) capsule structure, comprising the operations of: providing a non-polar layered conductive polymer having a plurality of chemical bonds on a surface thereof; capturing a plurality of organic electroluminescent molecules of an organic electroluminescent substance by the plurality of chemical bonds of the non-polar layered conductive polymer; and performing capsule encapsulation of the non-polar layered conductive polymer having the captured plurality of organic electroluminescent molecules. The present disclosure also provides a method for forming an OLED light-emitting layer, and an OLED capsule structure.

20 Claims, 6 Drawing Sheets

(51) Int. Cl.
 H01L 21/02 (2006.01)
 H01L 51/00 (2006.01)

(56) References Cited

FOREIGN PATENT DOCUMENTS

CN 108565361 A 9/2018
CN 208385460 U 1/2019

OTHER PUBLICATIONS

European search report issued in corresponding European application No. EP19176425, dated Oct. 21, 2019 (8 pages).
Jae-Seok Heo et al, Novel Light Emitting Diode Using Organic Electroluminescence Microcapsules, Macromolecular Chemistry and Physics, Nov. 1, 2003, pp. 2002-2006, vol. 204, No. 16.

* cited by examiner

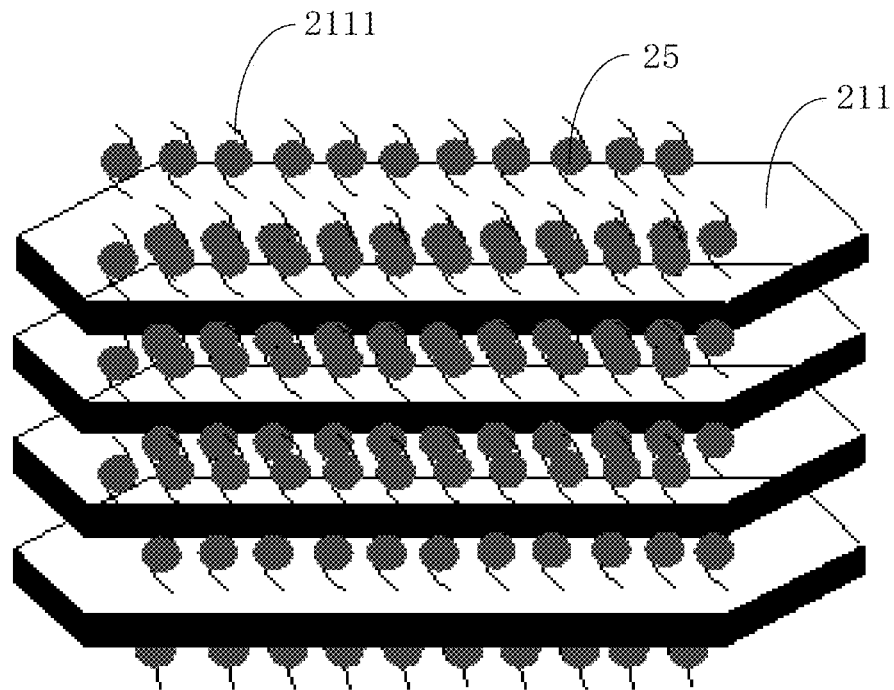

FIG. 6

710 providing a non-polar layered conductive polymer having a plurality of chemical bonds on a surface thereof 720 capturing a plurality of organic electroluminescent molecules of an organic electroluminescent substance by the plurality of chemical bonds of the non-polar layered conductive polymer 730 performing capsule encapsulation of the non-polar layered conductive polymer having the captured plurality of organic electroluminescent molecules

FIG. 7

ENCAPSULATING METHOD FOR OLED CAPSULE STRUCTURE, FORMING METHOD FOR OLED LIGHT-EMITTING LAYER, AND OLED CAPSULE STRUCTURE

CROSS-REFERENCE TO RELATED APPLICATION(S)

This application claims priorities to Chinese Patent Application Nos. 201810522258.6 and 201820801433.0, both filed on May 25, 2018, the contents of both of which are herein incorporated by reference in their entireties.

TECHNICAL FIELD

The present disclosure relates to the field of display encapsulation, particularly to an organic light-emitting diode (OLED) capsule structure and an encapsulating method for the OLED capsule structure, an OLED light-emitting layer and a forming method for the OLED light-emitting layer, and a display panel and an electronic device.

BACKGROUND

Since an organic luminescent substance of an OLED light-emitting layer is easily affected by water oxygen, it is needed to carry out encapsulation between upper and lower substrates encapsulating the OLED light-emitting layer to block impact of water-oxygen on the organic luminescent substance of the OLED light-emitting layer. However, such encapsulation makes the OLED light-emitting layer have great encapsulation thickness and encapsulation difficulty.

SUMMARY

An embodiment of the present disclosure provides a method for encapsulating an OLED capsule structure. The method includes the operations of: providing a non-polar layered conductive polymer having a plurality of chemical bonds on a surface thereof; capturing a plurality of organic electroluminescent molecules of an organic electroluminescent substance by the plurality of chemical bonds of the non-polar layered conductive polymer; and performing capsule encapsulation of the non-polar layered conductive polymer having the captured plurality of organic electroluminescent molecules.

An embodiment of the present disclosure provides a method for forming an OLED light-emitting layer. The method includes the operations of: blending a plurality of OLED capsule structures and polymer water-soluble liquid in a certain ratio to form a coating liquid, wherein the capsule structure comprises: a capsule core, a capsule shell and an organic electroluminescent substance, the capsule core being a non-polar layered conductive polymer having a plurality of chemical bonds on a surface thereof, the plurality of chemical bonds respectively adsorbing a plurality of organic electroluminescent molecules of the organic electroluminescent substance, the capsule shell packaging the capsule core and the plurality of organic electroluminescent molecules for capsule encapsulation; and providing a display substrate, and coating the coating liquid on a position of a corresponding pixel of the display substrate to form an OLED light-emitting layer.

An embodiment of the present disclosure provides an OLED capsule structure. The capsule structure includes: a capsule core, a capsule shell and an organic electroluminescent substance. The capsule core is a non-polar layered conductive polymer having a plurality of chemical bonds on a surface thereof. The plurality of chemical bonds respectively adsorb a plurality of organic electroluminescent molecules of the organic electroluminescent substance. The capsule shell packages the capsule core and the plurality of organic electroluminescent molecules for capsule encapsulation.

BRIEF DESCRIPTION OF DRAWINGS

In order to more clearly illustrate technical solutions of embodiments of the present disclosure, the drawings required to be used in the embodiments will be briefly described below. Evidently, the drawings in the following description are some embodiments of the present disclosure, and other drawings can also be obtained by those ordinarily skilled in the art according to these drawings without any creative work.

FIG. 6 is a structural diagram of a non-polar layered conductive polymer after capturing organic electroluminescent molecules according to an embodiment of the present disclosure.

FIG. 7 is a flow diagram of a method for encapsulating an OLED capsule structure according to an embodiment of the present disclosure.

DETAILED DESCRIPTION

Figure 1:
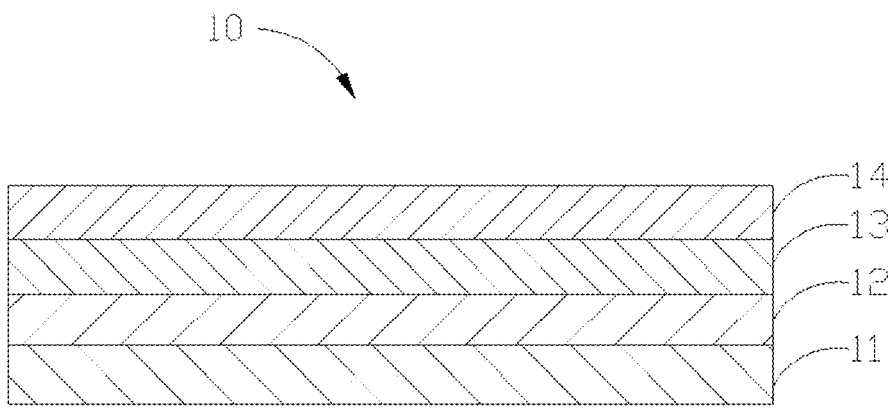
FIG. 1 is a cross-sectional diagram of a display panel according to an embodiment of the present disclosure.

In order to make those skilled in the art better understood the solutions of the present disclosure, the technical solutions in the embodiments of the present disclosure will be clearly described below in conjunction with the accompanying drawings in the embodiments of the present disclosure. Obviously, the described embodiments are only some of the embodiments, not all of the embodiments. All other embodiments obtained by those ordinarily skilled in the art based on the embodiments of the present disclosure without any creative work shall fall within the protection scope of the present disclosure.

The terms "first", "second", "third" and the like in the description and claims of the present disclosure and the aforementioned drawings are used to make a distinction between different objects, and are not intended to describe a specific order. Furthermore, the terms "comprise", "include", and any variants thereof are intended for non-exclusive inclusion. For example, a process, method, system, product, or device that comprises a series of operations or units is not limited to the listed operations or units, but optionally also includes operations or units not listed, or, optionally other operations or units inherent in the process, method, product or device.

The present disclosure relates to a method for encapsulating an organic light-emitting diode (OLED) capsule structure. The method includes the operations of: providing a non-polar layered conductive polymer having a plurality of chemical bonds on a surface thereof; capturing a plurality of organic electroluminescent molecules of an organic electroluminescent substance by the plurality of chemical bonds of the non-polar layered conductive polymer; and performing capsule encapsulation of the non-polar layered conductive polymer having the captured plurality of organic electroluminescent molecules.

In at least one embodiment, the operation of "capturing a plurality of organic electroluminescent molecules of an organic electroluminescent substance by the plurality of chemical bonds of the non-polar layered conductive polymer" is specifically: heating the organic electroluminescent substance and the non-polar layered conductive polymer to undergo chemical reaction such that the plurality of chemical bonds on the surface of the non-polar layered conductive polymer respectively capture the plurality of organic electroluminescent molecules in the electroluminescent substance, and thereby the plurality of organic electroluminescent molecules are sequentially arranged on the surface of the non-polar layered conductive polymer.

In at least one embodiment, a temperature of the heating is 300° C. or more.

In at least one embodiment, the temperature of the heating is 300° C. to 700° C.

In at least one embodiment, the non-polar layered conductive polymer is made in a manner that a layered polymer is sputtered by metal ions or is added with partial free radical.

In at least one embodiment, the layered polymer is a layered vinyl polymer.

In at least one embodiment, the operation of "performing capsule encapsulation of the non-polar layered conductive polymer having the captured plurality of organic electroluminescent molecules" is specifically: using a transparent conductive thin film with a water-oxygen blocking function to package the non-polar layered conductive polymer having the captured plurality of organic electroluminescent molecules to encapsulate the non-polar layered conductive polymer.

In at least one embodiment, a process of "performing capsule encapsulation of the non-polar layered conductive polymer having the captured plurality of organic electroluminescent molecules" is chemical vapor deposition or physical vapor deposition.

In at least one embodiment, the non-polar layered conductive polymer having the captured plurality of organic electroluminescent molecules is encapsulated by a capsule shell, the capsule shell is a transparent conductive thin-film capsule shell, and the transparent conductive thin film is a graphite transparent conductive thin film or a semiconductor transparent conductive thin film.

The present disclosure further relates to a method for forming an OLED light-emitting layer. The method includes the operations of: blending a plurality of OLED capsule structures and polymer water-soluble liquid in a certain ratio to form a coating liquid, wherein the capsule structure includes: a capsule core, a capsule shell and an organic electroluminescent substance, the capsule core being a non-polar layered conductive polymer having a plurality of chemical bonds on a surface thereof, the plurality of chemical bonds respectively adsorbing a plurality of organic electroluminescent molecules of the organic electroluminescent substance, the capsule shell packaging the capsule core and the plurality of organic electroluminescent molecules for capsule encapsulation; and providing a display substrate, and coating the coating liquid on a position of a corresponding pixel of the display substrate to form an OLED light-emitting layer.

In at least one embodiment, a volume ratio between the capsule structures and the polymer water-soluble liquid is greater than or equal to 1.

In at least one embodiment, wherein a method for encapsulating the OLED capsule structure comprises the operations of: providing a non-polar layered conductive polymer having a plurality of chemical bonds on a surface thereof; capturing a plurality of organic electroluminescent molecules of an organic electroluminescent substance by the plurality of chemical bonds of the non-polar layered conductive polymer; and performing capsule encapsulation of the non-polar layered conductive polymer having the captured plurality of organic electroluminescent molecules.

In at least one embodiment, wherein the operation of "capturing a plurality of organic electroluminescent molecules of an organic electroluminescent substance by the plurality of chemical bonds of the non-polar layered conductive polymer" is specifically: heating the organic electroluminescent substance and the non-polar layered conductive polymer to undergo chemical reaction such that the plurality of chemical bonds on the surface of the non-polar layered conductive polymer respectively capture the plurality of organic electroluminescent molecules in the electroluminescent substance, and thereby the plurality of organic electroluminescent molecules are sequentially arranged on the surface of the non-polar layered conductive polymer.

The present disclosure further relates to an OLED capsule structure. The capsule structure includes: a capsule core, a capsule shell and an organic electroluminescent substance. The capsule core is a non-polar layered conductive polymer having a plurality of chemical bonds on a surface thereof. The plurality of chemical bonds respectively adsorb a plurality of organic electroluminescent molecules of the organic electroluminescent substance. The capsule shell packages the capsule core and the plurality of organic electroluminescent molecules for capsule encapsulation.

In at least one embodiment, the capsule core includes a layered polymer and metal ions sputtering on the layered polymer or partial free radical added to the layered polymer.

In at least one embodiment, the layered polymer is a layered vinyl polymer.

In at least one embodiment, the layered polymer is a layered polyethylene polymer, a layered polypropylene polymer, a layered polyvinyl chloride polymer or a layered polybutene polymer.

In at least one embodiment, each of the chemical bonds captures one organic electroluminescent molecule.

In at least one embodiment, the capsule shell is a transparent conductive thin-film.

In at least one embodiment, the transparent conductive thin film is a graphite transparent conductive thin film or a semiconductor transparent conductive thin film.

The present disclosure further relates to an OLED light-emitting layer. The OLED light-emitting layer includes a plurality of pixel points. Each of the pixel points includes a R pixel, a G pixel, or a B pixel; the R pixel, the G pixel, and the B pixel each includes a plurality of capsule structures arranged in an array. Each of the capsule structures includes:

a capsule core, a capsule shell and an organic electroluminescent substance. The capsule core is a non-polar layered conductive polymer having a plurality of chemical bonds on a surface thereof. The plurality of chemical bonds respectively adsorb a plurality of organic electroluminescent molecules of the organic electroluminescent substance. The capsule shell packages the capsule core and the plurality of organic electroluminescent molecules for capsule encapsulation.

In at least one embodiment, the capsule core includes a layered polymer and metal ions sputtering on the layered polymer or partial free radical added to the layered polymer.

In at least one embodiment, the layered polymer is a layered vinyl polymer.

In at least one embodiment, the layered polymer is a layered polyethylene polymer, a layered polypropylene polymer, a layered polyvinyl chloride polymer or a layered polybutene polymer.

In at least one embodiment, each of the chemical bonds captures one organic electroluminescent molecule.

In at least one embodiment, the capsule shell is a transparent conductive thin-film.

In at least one embodiment, the transparent conductive thin film is a graphite transparent conductive thin film or a semiconductor transparent conductive thin film.

The present disclosure further relates to a display panel. The display panel includes: a substrate layer, an OLED light-emitting layer, an anode layer, and a cathode layer. The OLED light-emitting layer includes a plurality of pixel points. Each of the pixel points includes a R pixel, a G pixel, or a B pixel; the R pixel, the G pixel, and the B pixel each includes a plurality of capsule structures arranged in an array. Each of the capsule structures includes: a capsule core, a capsule shell and an organic electroluminescent substance. The capsule core is a non-polar layered conductive polymer having a plurality of chemical bonds on a surface thereof. The plurality of chemical bonds respectively adsorb a plurality of organic electroluminescent molecules of the organic electroluminescent substance. The capsule shell packages the capsule core and the plurality of organic electroluminescent molecules for capsule encapsulation. The anode layer is laminated on the substrate layer, the OLED light-emitting layer is laminated on the anode layer, the cathode layer is laminated on the OLED light-emitting layer, wherein the capsule structures are electrically conductive therebetween. The capsule structures, and the anode layer and the cathode layer are electrically conductive therebetween; and the plurality of organic electroluminescent molecules within each of the capsule structures are driven to illustrate when a voltage is applied between the anode layer and the cathode layer.

In at least one embodiment, the capsule core includes a layered polymer and metal ions sputtering on the layered polymer or partial free radical added to the layered polymer.

In at least one embodiment, the layered polymer is a layered vinyl polymer.

In at least one embodiment, the layered polymer is a layered polyethylene polymer, a layered polypropylene polymer, a layered polyvinyl chloride polymer or a layered polybutene polymer.

In at least one embodiment, each of the chemical bonds captures one organic electroluminescent molecule.

In at least one embodiment, the capsule shell is a transparent conductive thin-film.

The present disclosure further relates to an electronic device. The electronic device includes a display panel. The display panel includes: a substrate layer, an OLED light-emitting layer, an anode layer, and a cathode layer. The OLED light-emitting layer includes a plurality of pixel points. Each of the pixel points includes a R pixel, a G pixel, or a B pixel; the R pixel, the G pixel, and the B pixel each includes a plurality of capsule structures arranged in an array. Each of the capsule structures includes: a capsule core, a capsule shell and an organic electroluminescent substance. The capsule core is a non-polar layered conductive polymer having a plurality of chemical bonds on a surface thereof. The plurality of chemical bonds respectively adsorb a plurality of organic electroluminescent molecules of the organic electroluminescent substance. The capsule shell packages the capsule core and the plurality of organic electroluminescent molecules for capsule encapsulation. The anode layer is laminated on the substrate layer, the OLED light-emitting layer is laminated on the anode layer, the cathode layer is laminated on the OLED light-emitting layer, wherein the capsule structures are electrically conductive therebetween. The capsule structures, and the anode layer and the cathode layer are electrically conductive therebetween; and the plurality of organic electroluminescent molecules within each of the capsule structures are driven to illustrate when a voltage is applied between the anode layer and the cathode layer.

Reference is made to FIG. 1, which is a cross-sectional diagram of a display panel 10 according to an embodiment of the present disclosure. The display panel 10 is used for content display. The display panel 10 can be applied to electronic devices. The electronic devices may include various kinds of electronic devices having a display function, such as a mobile phone, a tablet computer, a Personal Digital Assistant (PDA), a Mobile Internet Device (MID), and a smart wearable device (such as a smart watch or a smart bracelet), with no limitation set in the embodiment of the present disclosure.

Specifically, the display panel 10 includes a substrate layer 11, an anode layer 12, an OLED light-emitting layer 13, and a cathode layer 14. The anode layer 12 is laminated on the substrate layer 11. The OLED light-emitting layer 13 is laminated on the anode layer 12. The cathode layer 14 is laminated on the OLED light-emitting layer 13. The anode layer 12 is generally made of a conductive material having a high work function and excellent light transmittance. For example, the anode layer 12 is a metal conductive thin film made of indium tin oxide (ITO). The OLED light-emitting layer 13 is generally prepared by doping a fluorescent matrix material with a fluorescent dopant. The cathode layer 14 is generally made of organic metal having a low work function. For example, the cathode layer 14 is an organic thin-film metal electrode prepared by a vapor plating method. When a direct current positive voltage of 2V to 10V is applied to the anode layer 12, and the cathode layer 14 is grounded, holes generated by the anode layer 12 and electrons generated by the cathode layer 14 respectively move toward each other, and meet at the OLED light-emitting layer 13. When the holes and the electrons meet at the OLED light-emitting layer 13, energy excitons are generated, thereby exciting luminescent molecules to eventually produce visible light.

Figure 2:
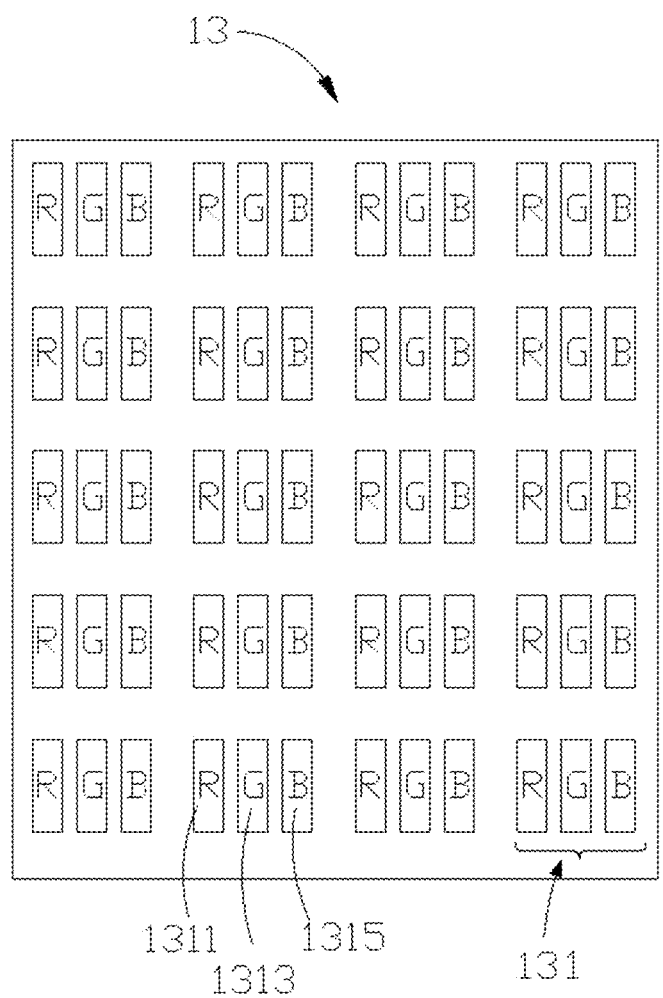
FIG. 2 is a structural diagram of an OLED light-emitting layer according to an embodiment of the present disclosure.

Reference is made to FIG. 2, which is a structural diagram of an OLED light-emitting layer 13 according to an embodiment of the present disclosure. The OLED light-emitting layer 13 includes a plurality of pixel points 131 arranged in an array. Each of the pixel points 131 includes three sub-pixels, namely, a R pixel 1311, a G pixel 1313, and a B pixel 1315. The R pixel 1311 is driven to generate red light; the G pixel 1313 is driven to generate green light; and the B pixel 1315 is driven to generate blue light. The light generated by the R pixel 1311, the G pixel 1313, and the B pixel 1315 is subjected to color mixing in a certain ratio to generate light of various colors.

Figure 3:
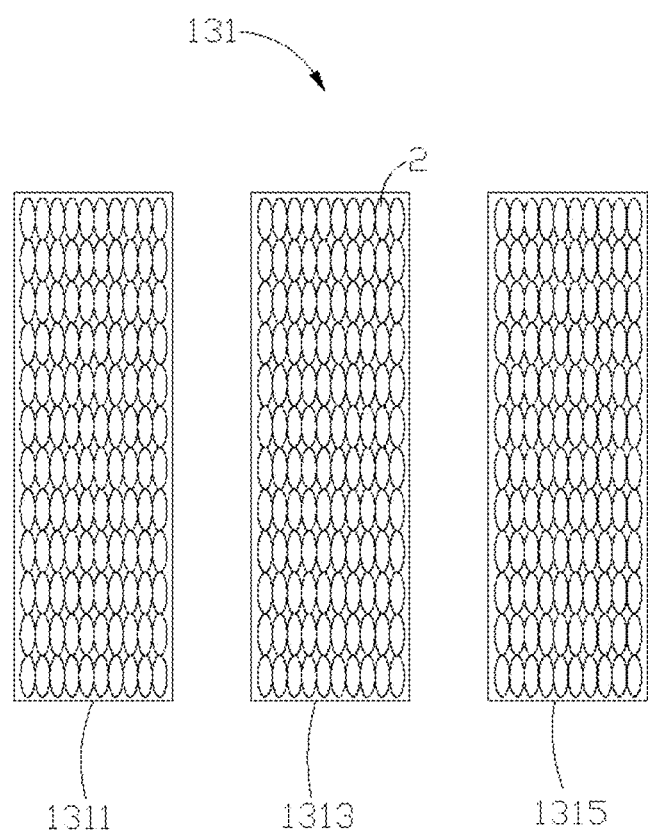
FIG. 3 is an enlarged diagram of an OLED pixel according to an embodiment of the present disclosure.

Referring to FIG. 3, the R pixel 1311 includes a plurality of capsule structures 2 arranged in an array. The capsule structures 2 can be electrically conductive therebetween; and the capsule structure 2, and the anode layer 12 and the cathode layer 14 can also be electrically conductive therebetween. Thus, a voltage is applied between the anode layer 12 and the cathode layer 14 to drive the plurality of capsule structures 2 to be energized and emit red light.

The G pixel 1313 includes a plurality of capsule structures 2 arranged in an array. The capsule structures 2 can be electrically conductive therebetween; and the capsule structure 2, and the anode layer 12 and the cathode layer 14 can also be electrically conductive therebetween. Thus, a voltage is applied between the anode layer 12 and the cathode layer 14 to drive the plurality of capsule structures 2 to be energized and emit green light.

The B pixel 1315 also includes a plurality of capsule structures 2 arranged in an array. The capsule structures 2 can be electrically conductive therebetween; and the capsule structure 2, and the anode layer 12 and the cathode layer 14 can also be electrically conductive therebetween. Thus, a voltage is applied between the anode layer 12 and the cathode layer 14 to drive the plurality of capsule structures 2 to be energized and emit blue light.

Figure 4:
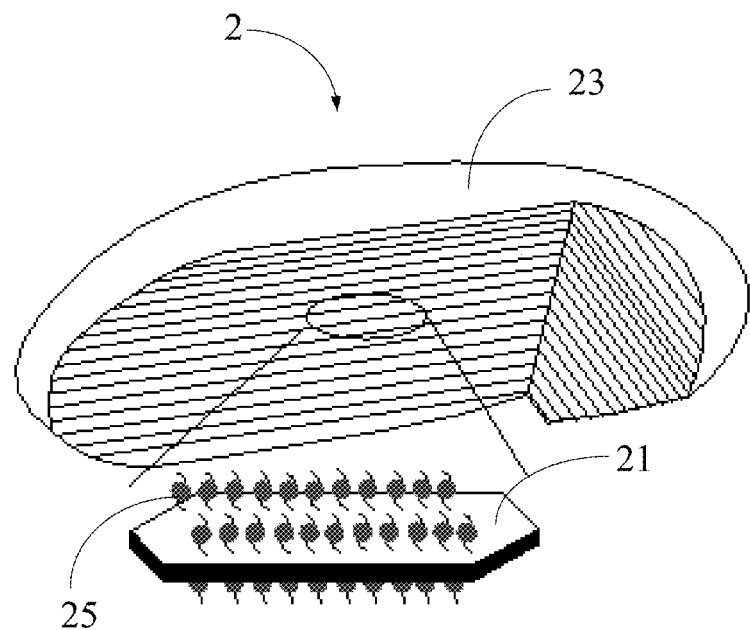
FIG. 4 is a structural diagram of an OLED capsule structure according to an embodiment of the present disclosure.
Figure 5:
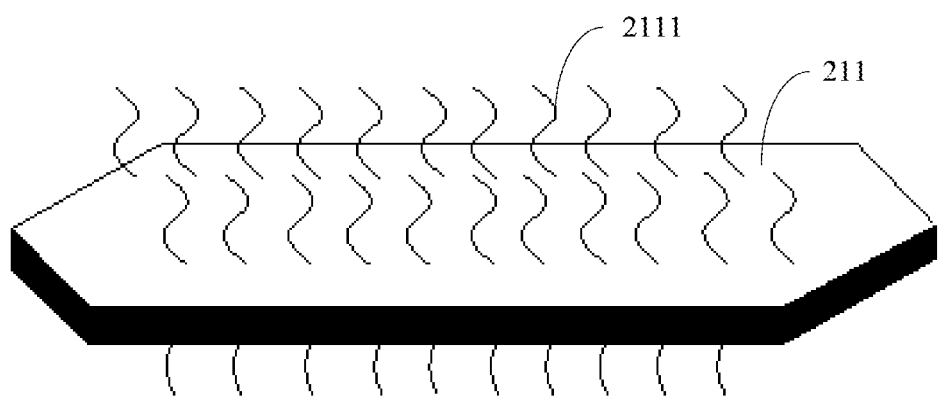
FIG. 5 is a structural diagram of each layer of a non-polar layered conductive polymer according to an embodiment of the present disclosure.

Referring to FIG. 4, the capsule structure 2 includes a capsule core 21, a capsule shell 23 and a plurality of organic electroluminescent molecules 25. Referring to FIG. 5 and FIG. 6, the capsule core 21 includes at least one layer of non-polar layered conductive polymer 211, and a surface of each layer of the non-polar layered conductive polymer 211 has a plurality of chemical bonds 2111. The chemical bonds 2111 are used to capture the organic electroluminescent molecules 25 of the organic electroluminescent substance. Specifically, each of the chemical bonds 2111 is used to capture an organic electroluminescent molecule 25. The capsule shell 23 packages the capsule core 21 and the plurality of organic electroluminescent molecules 25 for capsule encapsulation. A voltage is applied between the anode layer 12 and the cathode layer 14 to thereby drive the plurality of organic electroluminescent molecules 25 within the capsule structure 2 to emit light. Specifically, the organic electroluminescent substance is a material that satisfies the conditions of: having excellent semiconductor properties and relatively high carrier mobility; having high fluorescence quantum efficiency in a solid thin film state, main distribution of fluorescence excitation spectra in a region of visible light of 400-700 nm, and pure light color; having an excellent film-forming property and being suitable for vacuum vapor plating film forming; and having excellent thermal stability and mechanical processing properties. For example, the red light material may be 2,7-dithienyl-9-fluorenone (DFTO); the green light material may be 8-hydroxyquinoline aluminum; and the blue light material may be 9,10-bis(6-tert-butyl)naphthalene-2-methylindole (MDTBADN).

The principle of capturing the organic electroluminescent molecules 25 by the chemical bonds 2111 of the non-polar layered conductive polymer 211 is specifically: placing the organic electroluminescent substance and the non-polar layered conductive polymer 211 into a heating container for heating to undergo chemical reaction such that the plurality of chemical bonds 2111 on the surface of the non-polar layered conductive polymer 211 respectively capture the organic electroluminescent molecules 25 of the organic electroluminescent substance, and thereby the plurality of organic electroluminescent molecules 25 are sequentially arranged on the surface of the non-polar layered conductive polymer 211.

In the present embodiment, the heating container is a crucible furnace. It can be understood that, in other embodiments, the heating container may also be other heating devices, with no limitation set herein.

In the present embodiment, a temperature of the heating is 300° C. or more. It can be understood that, an upper limit of the temperature of the heating is 700° C., thereby avoiding the crucible furnace itself from being melted.

Specifically, the capsule core 21 includes a layered polymer and metal ions sputtering on the layered polymer or partial free radical added to the layered polymer. The free radical refers to an atom or a group having unpaired electrons formed by homolysis of covalent bonds in molecules of the compound under external conditions, for example, photothermal condition.

In one embodiment, the layered polymer is a layered ethyl polymer, for example, a layered polyethylene polymer, a layered polypropylene polymer, a layered polyvinyl chloride polymer, or a layered polybutene polymer, etc. It can be understood that, in other embodiments, the layered polymer may also be other kinds of layered polymers, with no limitation set herein.

Further, the capsule shell 23 is a transparent conductive thin-film capsule shell; the capsule shell is a transparent conductive thin-film capsule shell; and the transparent conductive thin film is a graphite transparent conductive thin film or a semiconductor transparent conductive thin film.

Further, the encapsulating process in which the capsule shell 23 packages the capsule core 21 and the plurality of organic electroluminescent molecules 25 for encapsulation is chemical vapor deposition or physical vapor deposition.

The organic electroluminescent molecules 25 within the R pixel 1311 are used to emit red light; the organic electroluminescent molecules 25 within the G pixel 1313 are used to emit green light; and the organic electroluminescent molecules 25 within the B pixel 1315 are used to emit blue light. Since different colors of light can be produced depending on organic electroluminescent substances of different materials, the structures of the organic electroluminescent molecules 25 within the R pixel 1311, the organic electroluminescent molecules 25 within the G pixel 1313, and the organic electroluminescent molecules 25 within the B pixel 1315 differ from each other. In other words, the R pixel 1311, the G pixel 1313, and the B pixel 1315 are respectively made of different organic luminescent materials. For example, 2,7-dithienyl-9-fluorenone (DFTO) can be applied to the R Pixel 1311 to produce red light; 8-hydroxyquinoline aluminum (Alq3) can be widely used for the G pixel 1313 to produce green light; and 9,10-bis(6-tert-butyl)naphthalene-2-methylindole (MDTBADN) can be applied to the B pixel 1315 to produce blue light.

Lifespans of different sub-pixels after being electrified and aged are different. That is, the materials of the capsule core and the capsule shell of the capsule structure 2 forming the R pixel 1311, the materials of the capsule core and the capsule shell of the capsule structure forming the G pixel 1313, and the materials of the capsule core and the capsule shell of the capsule structure forming the B pixel 1315 can be differentially adjusted such that the lifespans of the R pixel 1311, the G pixel 1313, and the B pixel 1315 being electrified and aged are identical.

Reference is made to FIG. 7, which is a flow diagram of a method for encapsulating an OLED capsule structure according to an embodiment of the present disclosure. The order of execution of the method for encapsulating an OLED capsule structure is not limited to the order shown in FIG. 7. The method includes the operations as follows.

Operation 710: providing a non-polar layered conductive polymer having a plurality of chemical bonds on a surface thereof.

Specifically, the non-polar layered conductive polymer 211 is made of a layered polymer on which metal ions are sputtered or to which partial free radical is added.

More specifically, in one embodiment, the layered polymer is a layered vinyl polymer, for example, a layered polyethylene polymer, a layered polypropylene polymer, a layered polyvinyl chloride polymer or a layered polybutene polymer, etc.

Operation 720: capturing a plurality of organic electroluminescent molecules of an organic electroluminescent substance by the plurality of chemical bonds of the non-polar layered conductive polymer.

Specifically, referring to FIG. 6, the organic electroluminescent substance and the non-polar layered conductive polymer 211 are heated to undergo chemical reaction such that the plurality of chemical bonds 2111 on the surface of the non-polar layered conductive polymer 211 respectively capture the plurality of organic electroluminescent molecules 25 in the organic electroluminescent substance, and thereby the plurality of organic electroluminescent molecules 25 are sequentially arranged on the surface of the non-polar layered conductive polymer 211.

More specifically, the organic electroluminescent substance and the non-polar layered conductive polymer 211 are placed in a heating container for heating to undergo chemical reaction such that the plurality of chemical bonds 2111 on the surface of the non-polar layered conductive polymer 211 respectively capture the plurality of organic electroluminescent molecules 25 in the organic electroluminescent substance, and thereby the plurality of organic electroluminescent molecules 25 are sequentially arranged on the surface of the non-polar layered conductive polymer 211. Since the plurality of chemical bonds 2111 on the surface of the non-polar layered conductive polymer 211 are substantially equidistantly distributed, and the distance is a nanometer distance, a molecular layer formed in a manner that the plurality of organic electroluminescent molecules 25 have been captured by a plurality of chemical bonds 2111 takes on a nanometer distance, and has a certain tiling effect.

In the present embodiment, the heating container is a crucible furnace. It can be understood that, in other embodiments, the heating container may also be other heating devices, with no limitation set herein.

In the present embodiment, a temperature of the heating is 300° C. or more. It can be understood that, an upper limit of the temperature of the heating may be 700° C.

Operation 730: performing capsule encapsulation of the non-polar layered conductive polymer having the captured plurality of organic electroluminescent molecules.

Specifically, the non-polar layered conductive polymer that has the captured plurality of organic electroluminescent molecules is packaged by a transparent conductive thin film having a water-oxygen blocking function to encapsulate the non-polar layered conductive polymer.

Specifically, the water-oxygen blocking function refers to a function of blocking water and oxygen.

Specifically, the transparent conductive thin film has transparent, conductive first-level water-oxygen insulating properties. For example, the transparent conductive thin film can be a graphite transparent conductive thin film or a semiconductor transparent conductive thin film.

Specifically, the process for encapsulating the non-polar layered conductive polymer having the captured plurality of organic electroluminescent molecules is chemical vapor deposition (CVD) or physical vapor deposition (PVD). The chemical vapor deposition refers to a process in which steam comprising a gaseous reactant or a liquid reactant forming thin film element and other gases required for the reaction are introduced into a reaction chamber to undergo reaction on a surface of the substrate to generate a thin film. The physical vapor deposition refers to a technology in which a material source-solid or liquid surface is gasified into gaseous atoms or molecules, or partially ionized into ions under vacuum conditions by means of a physical process, and a thin film with a particular function is deposited on the surface of the substrate via a low-pressure gas (or plasma) process.

Specifically, referring to FIG. 4, each capsule structure 2 includes a plurality of layers of non-polar layered conductive polymer 211, and each chemical bond 2111 of each layer of the non-polar layered polymer 211 adsorbs organic electroluminescent molecules 25.

Figure 8:
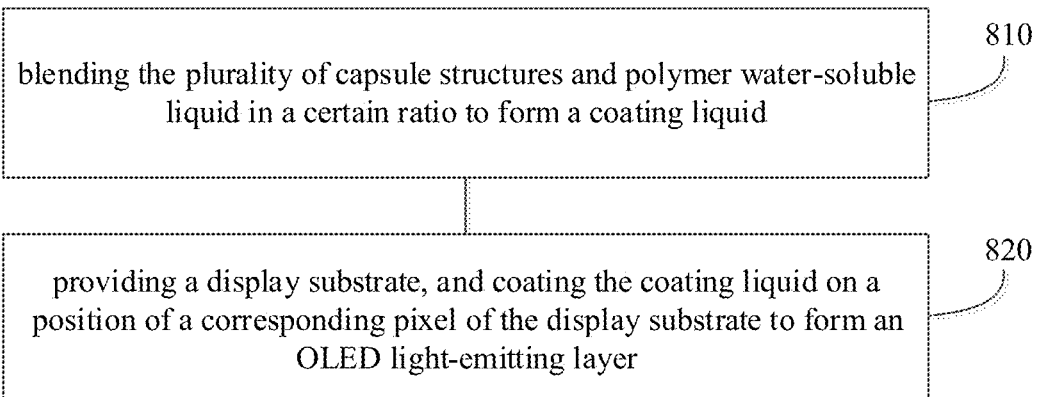
FIG. 8 is a flow diagram of a method for forming an OLED light-emitting layer according to an embodiment of the present disclosure.

Reference is made to FIG. 8, which is a flow diagram of a method for forming an OLED light-emitting layer according to an embodiment of the present disclosure. The order of execution of the method for forming an OLED light-emitting layer is not limited to the order shown in FIG. 8. The method includes the operations as follows.

Operation 810: blending the plurality of capsule structures and polymer water-soluble liquid in a certain ratio to form a coating liquid.

Specifically, the polymer water-soluble liquid has cohesiveness and oxygen-insulating properties. For example, the polymer water-soluble liquid may be a polyethylene solution. When the liquid is used for coating to form a R pixel, the capsule structure is a capsule structure for emitting red light; when it is used for coating to form a G pixel, the capsule structure is a capsule structure for emitting green light; and when it is used for coating to form a B pixel, the capsule structure is a capsule structure for emitting blue light.

Specifically, a volume ratio between the capsule structure 2 and the polymer water-soluble liquid is greater than or equal to 1, for example, 1:1, and may also be 1.2:1, 1.4:1, or the like.

Operation 820: providing a display substrate, and coating the coating liquid on a position of a corresponding pixel of the display substrate to form an OLED light-emitting layer.

When used for coating to form a R pixel, a coating liquid for coating to form a R pixel is coated on a position of the corresponding R pixel of the display substrate to form a R pixel.

When used for coating to form a G pixel, a coating liquid for coating to form a G pixel is coated on a position of the corresponding G pixel of the display substrate to form a G pixel.

When used for coating to form a B pixel, a coating liquid for coating to form a B pixel is coated on a position of the corresponding B pixel of the display substrate to form a B pixel.

Figure 9:
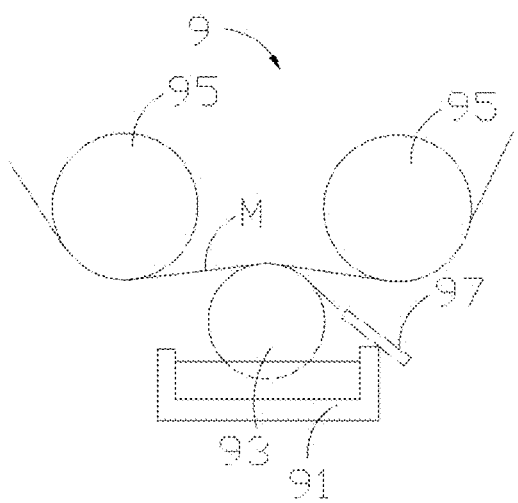
FIG. 9 is a structural diagram of an OLED light-emitting layer coating and forming device according to an embodiment of the present disclosure.

Reference is made to FIG. 9, which is a structural diagram of an OLED light-emitting layer coating and forming device 9 according to an embodiment of the present disclosure. The above coating forming process may be a relief-block coating forming process.

The coating and forming device 9 includes a liquid tank 91, a pattern roller 93, two guide rollers 95 and a scraper 97. The axes of the two guide rollers 95 and the pattern roller 93 are arranged in parallel. The two guide rollers 95 are located above the pattern roller 93. The scraper 97 is disposed adjacent to the pattern roller 93. The coating liquid is arranged in the liquid tank 91. One side of the pattern roller 93 is immersed in the coating liquid of the liquid tank 91. The display substrate M is of flexibility and is disposed between the two guide rollers 95 and the pattern roller 93, and the other side of the pattern roller 93 is pressed against the display substrate M. Thereby, it is possible to print on the display substrate M.

It can be understood that, the display substrate M may be a layered structure separately disposed for supporting the light-emitting layer 13, or may be the anode layer 12 or the cathode layer 14 disposed adjacent to the light emitting layer 12.

It can be understood that, in other embodiments, the display panel 100 further includes a hole transport layer and an electron transport layer. The hole transport layer may be disposed between the anode layer 12 and the light-emitting layer 13. The electron transport layer may be disposed between the light-emitting layer 13 and the cathode layer 14. Thus, the display substrate M may also be the hole transport layer or the electron transport layer.

It should be noted that the capsule structure in the present disclosure is not limited to a micron-sized capsule, and may also be a nano-sized capsule.

Figure 10:
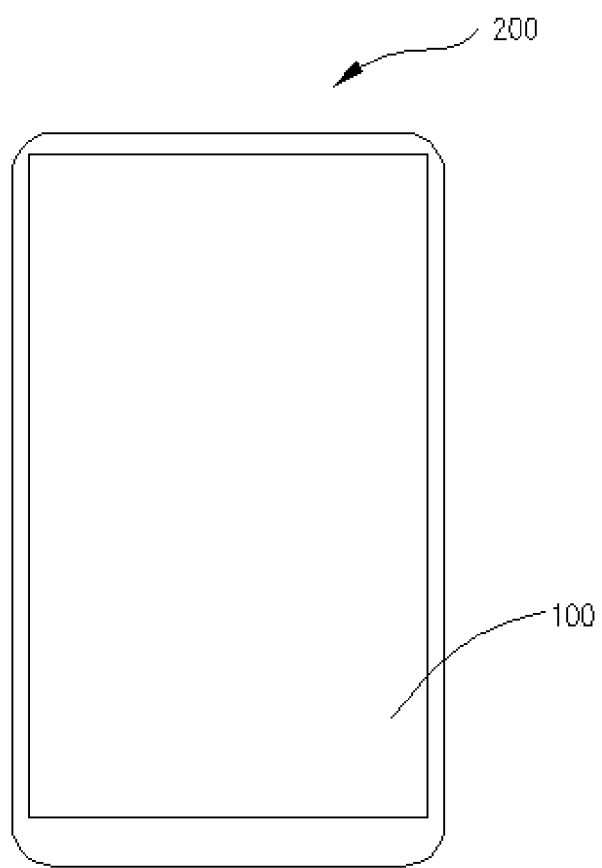
FIG. 10 is a frontal diagram of an electronic device according to an embodiment of the present disclosure.

Referring to FIG. 10, the electronic device 200 can be an electronic device with a display function, such as a mobile phone, a tablet computer, an E-reader, a wearable electronic device, etc. The display panel 100 can be a display structure in the electronic device 200.

In the OLED capsule structure and the encapsulating method, the OLED light-emitting layer and the forming method, the display panel and the electronic device provided by the present disclosure, by encapsulating the plurality of organic electroluminescent molecules in the form of capsule structure, can block water oxygen in advance, and reduce encapsulation difficulty and encapsulation thickness.

In the above embodiments, the descriptions of the respective embodiments emphasize different aspects, and portions that are not described in detail in a certain embodiment can be referred to in the related descriptions of other embodiments.

The operations in the method of the embodiments of the present disclosure may be sequentially adjusted, combined, and deleted according to actual needs.

The foregoing are embodiments of the present disclosure. It should be noted that those skilled in the art can also make some improvements and modifications without departing from the principles of the embodiments of the present disclosure. These improvements and modifications shall also be considered as the scope of protection of the present disclosure.

What is claimed is:

1. A method for encapsulating an organic light-emitting diode (OLED) capsule structure, the method comprising:
   providing a non-polar layered conductive polymer a plurality of chemical bonds on a surface thereof;
   capturing a plurality of organic electroluminescent molecules of an organic electroluminescent substance by the plurality of chemical bonds of the non-polar layered conductive polymer; and
   performing capsule encapsulation of the non-polar layered conductive polymer having the captured plurality of organic electroluminescent molecules.

2. The method for encapsulating an OLED capsule structure according to claim 1, wherein capturing the plurality of organic electroluminescent molecules of the organic electroluminescent substance by the plurality of chemical bonds of the non-polar layered conductive polymer comprises:
   heating the organic electroluminescent substance and the non-polar layered conductive polymer to undergo chemical reaction such that the plurality of chemical bonds on the surface of the non-polar layered conductive polymer respectively capture the plurality of organic electroluminescent molecules in the electroluminescent substance, and thereby the plurality of organic electroluminescent molecules are sequentially arranged on the surface of the non-polar layered conductive polymer.

3. The method for encapsulating an OLED capsule structure according to claim 2, wherein a temperature of the heating is 300° C. or more.

4. The method for encapsulating an OLED capsule structure according to claim 3, wherein the temperature of the heating is 300° C. to 700° C.

5. The method for encapsulating an OLED capsule structure according to claim 1, wherein the non-polar layered conductive polymer is made in a manner that a layered non-polar polymer is sputtered by metal ions or is added with partial free radical.

6. The method for encapsulating an OLED capsule structure according to claim 5, wherein the layered non-polar polymer is a layered vinyl polymer.

7. The method for encapsulating an OLED capsule structure according to claim 1, wherein performing capsule encapsulation of the non-polar layered conductive polymer having the captured plurality of organic electroluminescent molecules comprises:
   using a transparent conductive thin film with a water-oxygen blocking function to package the non-polar layered conductive polymer having the captured plurality of organic electroluminescent molecules to encapsulate the non-polar layered conductive polymer.

8. The method for encapsulating an OLED capsule structure according to claim 7, wherein performing capsule encapsulation of the non-polar layered conductive polymer having the captured plurality of organic electroluminescent molecules is chemical vapor deposition or physical vapor deposition.

9. The method for encapsulating an OLED capsule structure according to claim 8, wherein the non-polar layered conductive polymer having the captured plurality of organic electroluminescent molecules is encapsulated by a capsule shell, the capsule shell is a transparent conductive thin-film capsule shell, and the transparent conductive thin film is a graphite transparent conductive thin film or a semiconductor transparent conductive thin film.

10. A method for forming an OLED light-emitting layer, the method comprising:
    blending a plurality of OLED capsule structures and polymer water-soluble liquid in a certain ratio to form a coating liquid, wherein the capsule structure comprises: a capsule core, a capsule shell and an organic electroluminescent substance, the capsule core being a non-polar layered conductive polymer having a plurality of chemical bonds on a surface thereof, the plurality of chemical bonds respectively adsorbing a plurality of organic electroluminescent molecules of the organic electroluminescent substance, the capsule shell packaging the capsule core and the plurality of organic electroluminescent molecules for capsule encapsulation; and providing a display substrate, and coating the coating liquid on a position of a corresponding pixel of the display substrate to form an OLED light-emitting layer.

11. The method for forming an ° LED light-emitting layer according to claim 10, wherein a volume ratio between the capsule structures and the polymer water-soluble liquid is greater than or equal to 1.

12. The method for forming an OLED light-emitting layer according to claim 10, wherein a method for encapsulating the OLED capsule structure comprises:

providing the non-polar layered conductive polymer having the plurality of chemical bonds on the surface thereof;

capturing a plurality of organic electroluminescent molecules of an organic electroluminescent substance by the plurality of chemical bonds of the non-polar layered conductive polymer; and performing capsule encapsulation of the non-polar layered conductive polymer having the captured plurality of organic electroluminescent molecules.

13. The method for forming an OLED light-emitting layer according to claim 12, wherein capturing the plurality of organic electroluminescent molecules of the organic electroluminescent substance by the plurality of chemical bonds of the non-polar layered conductive polymer comprises:

heating the organic electroluminescent substance and the non-polar layered conductive polymer to undergo chemical reaction such that the plurality of chemical bonds on the surface of the non-polar layered conductive polymer respectively capture the plurality of organic electroluminescent molecules in the electroluminescent substance, and thereby the plurality of organic electroluminescent molecules are sequentially arranged on the surface of the non-polar layered conductive polymer.

14. An OLED capsule structure, wherein the capsule structure comprises: a capsule core, a capsule shell and an organic electroluminescent substance, the capsule core being a non-polar layered conductive polymer having a plurality of chemical bonds on a surface thereof, the plurality of chemical bonds respectively adsorbing a plurality of organic electroluminescent molecules of the organic electroluminescent substance, the capsule shell packaging the capsule core and the plurality of organic electroluminescent molecules for capsule encapsulation.

15. The OLED capsule structure according to claim 14, wherein the capsule core is made in a manner that a layered non-polar polymer is sputtered with metal ions or is added with partial free radical.

16. The OLED capsule structure according to claim 15, wherein the layered non-polar polymer is a layered vinyl polymer.

17. The OLED capsule structure according to claim 15, wherein the layered non-polar polymer is a layered polyethylene polymer, a layered polypropylene polymer, a layered polyvinyl chloride polymer or a layered polybutene polymer.

18. The OLED capsule structure according to claim 14, wherein each of the chemical bonds captures one organic electroluminescent molecule.

19. The OLED capsule stricture according to claim 14, wherein the capsule shell is a transparent conductive thin-film.

20. The OLED capsule structure according to claim 19, wherein the transparent conductive thin film is a graphite transparent conductive thin film or a semiconductor transparent conductive thin film.

* * * * *